(12) United States Patent
Koh et al.

(10) Patent No.: US 6,368,771 B1
(45) Date of Patent: Apr. 9, 2002

(54) PHOTORESIST POLYMERS AND PHOTORESIST COMPOSITIONS CONTAINING THE SAME

(75) Inventors: Cha Won Koh; Geun Su Lee; Jae Chang Jung; Myoung Soo Kim, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/627,627

(22) Filed: Jul. 28, 2000

(30) Foreign Application Priority Data

Jul. 30, 1999 (KR) .............................. 99-31298

(51) Int. Cl.[7] .............................................. G03F 7/004
(52) U.S. Cl. ................... 430/270.1; 430/272.1; 430/312; 430/313; 526/279; 526/281
(58) Field of Search ......................... 430/270.1, 272.1, 430/312, 313; 526/281, 279

(56) References Cited

U.S. PATENT DOCUMENTS 5,288,827 A * 2/1994 Li et al. ..................... 526/279
6,159,655 A * 12/2000 Sato ......................... 430/270.1
6,291,131 B1 * 9/2001 Jung et al. ............... 430/270.1

\* cited by examiner

Primary Examiner—Rosemary Ashton
(74) Attorney, Agent, or Firm—Townsend and Townsend and Crew LLP

(57) ABSTRACT

The present invention discloses photoresist polymers and photoresist compositions containing the same. The photoresist polymer comprises repeating units derived from (a) a compound of Chemical Formula 1; (b) a compound of Chemical Formula 2; (c) a compound of Chemical Formula 3; and optionally (d) maleic anhydride. Photoresist compositions containing the polymers of the present invention have superior etching resistance, heat resistance and adhesiveness, are easily developed in the 2.38% aqueous TMAH solution, and are therefore suitable for lithography processes using ultraviolet light sources when fabricating a minute circuit of a high integration semiconductor device:

<Chemical Formula 1>

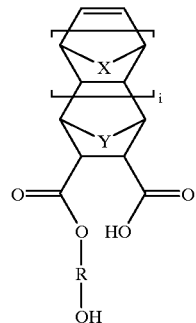

<Chemical Formula 2>

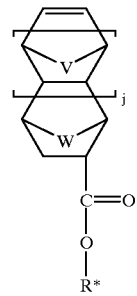

<Chemical Formula 3>

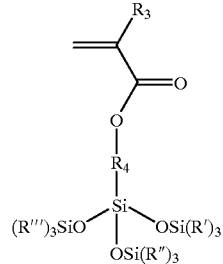

wherein R, R*, $R_3$, $R_4$, R', R'', R''', X, Y, V, W, i and j are as described herein.

27 Claims, 3 Drawing Sheets

PHOTORESIST POLYMERS AND PHOTORESIST COMPOSITIONS CONTAINING THE SAME

BACKGROUND OF THE INVENTION

1. Field of the Invention

The present invention relates to photoresist polymers and photoresist compositions containing the same, and in particular to photoresist polymers and compositions that are suitable for photolithography processes employing KrF, ArF, EUV and similar light sources.

2. Description of the Prior Art

Recently, chemical amplification-type DUV photoresists have been investigated in order to achieve high sensitivity in minute image formation processes for preparing semiconductor devices. Such photoresists are prepared by blending a photoacid generator and matrix resin polymer having an acid labile group.

In a photolithography process, an exposure of photoresist to light of a particular wavelength generates an acid from the photoacid generator that is present in the photoresist. This acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength of the light source—i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38% aqueous tetramethylammonium hydroxide (TMAH) solution. However, it is very difficult to synthesize a photoresist polymer that satisfies all of these requisites. For example, a polymer having a polyacrylate polymer backbone are readily available, but it has poor etching resistance and is difficult to develop. In order to increase its etching resistance, several groups have added an alicyclic unit to the polymer backbone. However, a photoresist copolymer comprising entirely of alicyclic polymer backbone is difficult to form.

To solve some of the problems described above, Bell Research Center developed a polymer having the following chemical structure, where the polymer backbone is substituted with norbornene, acrylate and maleic anhydride units.

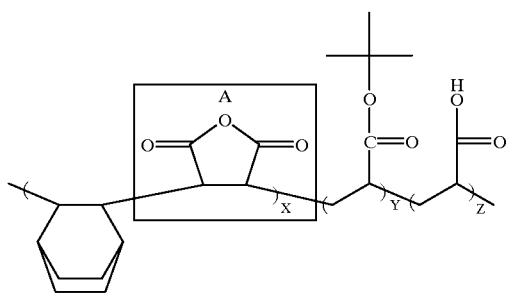

However, the above polymer has a problem in that even in the unexposed regions the maleic anhydride moiety ('A' portion), which is employed to polymerize alicyclic olefin groups, dissolves readily in 2.38 wt % aqueous TMAH solution. One solution to this problem is to increase the ratio of 'Y' portion having a tert-butyl substituent, but this increase results in a relative decrease in the amount of 'Z' portion (which is responsible for the adhesiveness of the photoresist polymer to the substrate). This decrease in the relative amount of the 'Z' portion may result in separation of the photoresist from the substrate during a pattern formation.

In order to solve the problem, cholesterol-type dissolution inhibitors have been added to the polymer to form a two-component system. However, since the amount of the dissolution inhibitor is very high [about 30% (w/w) of the resin], reproducibility of a pattern is low and the production cost is high, thereby making the system unsuitable as a PR.

In addition, many attempts have been made to improve the etching resistance of photoresist resins (see, for example, Journal of Photopolymer Science and Technology, Vol. 10, No. 3, 511–520 (1997)). Typically, the thickness of a photoresist layer must be less than 0.3 $\mu$m in order to form an ultra-fine pattern less than 0.10 $\mu$m. However, in most cases, a photoresist layer less than 0.3 $\mu$m is too thin to endure the etching gas used in the semiconductor device preparation process.

SUMMARY OF THE INVENTION

An object of the present invention is to provide novel photoresist polymers having excellent etching resistance, adhesiveness and photosensitivity, and a process for preparing the same.

Another object of the present invention is to provide photoresist compositions comprising the PR polymers described above, and a process for preparing the same.

Still another object of the present invention is to provide a semiconductor element produced by using the photoresist composition.

DETAILED DESCRIPTION OF THE PREFERRED EMBODIMENTS

Figure 1:
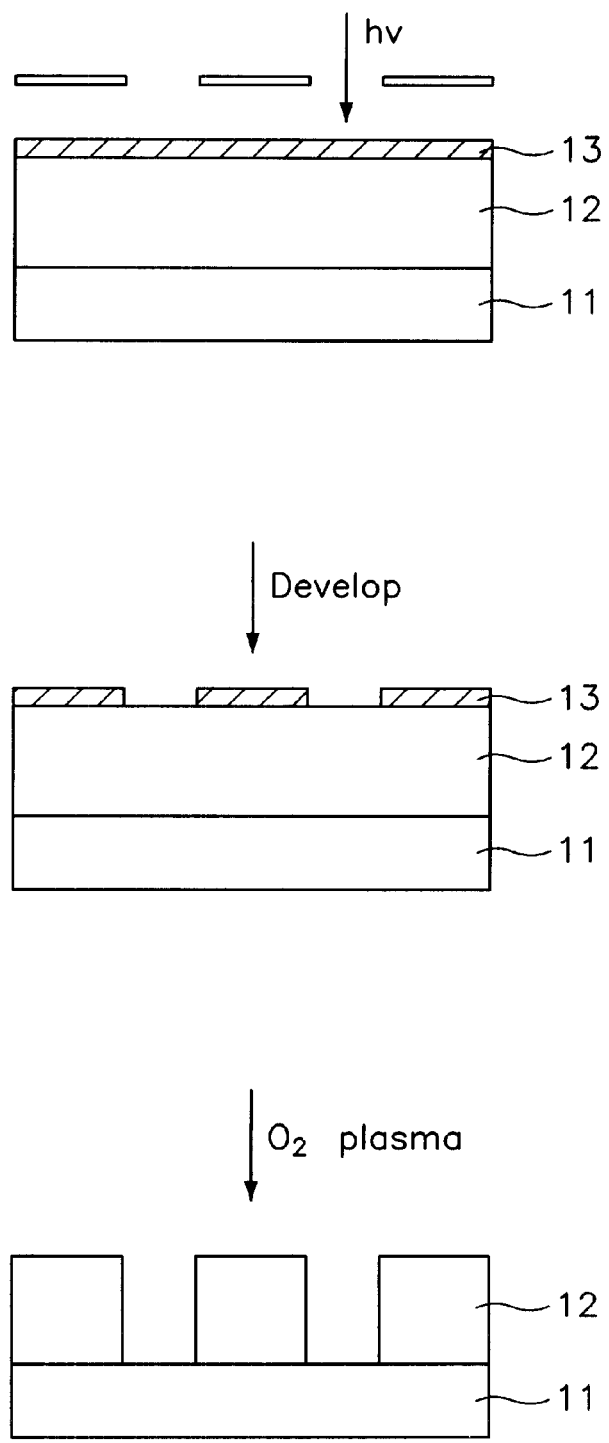
FIG. 1 is a schematic view illustrating a process for forming a photoresist pattern in accordance with the present invention.

The present invention provides polymers derived from monomers of Chemical Formulas 1–4 below. Backbone of such polymers is an alicyclic structure, which provides excellent adhesiveness and etching resistance. Moreover, the exposed region and the unexposed region of polymers of the present invention have a considerable solubility difference in a developing solution.

In one particular aspect, the present invention provides a photoresist polymer comprising repeating units derived from (a) a compound of Chemical Formula 1; (b) a compound of Chemical Formula 2; (c) a compound of Chemical Formula 3; and optionally (d) maleic anhydride of Chemical Formula 4:

<Chemical Formula 1>

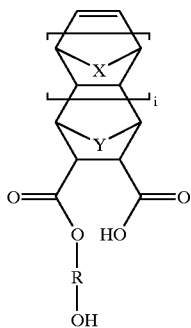

wherein, R is substituted or unsubstituted linear or branched ($C_1$–$C_{10}$) alkylene, substituted or unsubstituted ($C_2$–$C_{10}$) alkylene comprising an ether linkage, substituted or unsubstituted ($C_2$–$C_{10}$) alkylene comprising an ester linkage, or substituted or unsubstituted ($C_3$–$C_{10}$) alkylene comprising a ketone moiety;

X and Y are independently $CH_2$, $CH_2CH_2$, oxygen or sulfur; and i is an integer from 0 to 2.

<Chemical Formula 2>

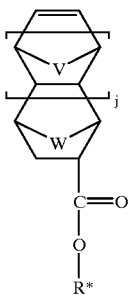

wherein, V and W are independently $CH_2$, $CH_2CH_2$, oxygen or sulfur;

R* is an acid-labile group; and j is an integer from 0 to 2.

<Chemical Formula 3>

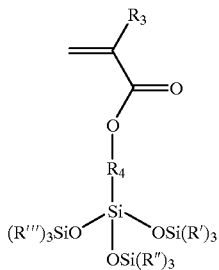

wherein $R_3$ represents hydrogen or methyl;

$R_4$ is substituted or unsubstituted linear or branched ($C_1$–$C_{10}$) alkylene;

R', R" and R''' are independently substituted or unsubstituted linear or branched ($C_1$–$C_5$) alkyl.

<Chemical Formula 4>

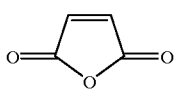

In particularly preferred compounds of Chemical Formula 1, R is represented by the following Chemical Formula 1a:

<Chemical Formula 1a>

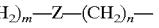

wherein, Z is

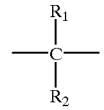

or oxygen;

$R_1$ and $R_2$ are independently H or an ($C_1$–$C_5$) alkyl; and m and n are independently an integer from 0 to 5, provided m and n are independently an integer from 1 to 5 when Z is oxygen; and R* is selected from the group consisting of tert-butyl, tetrahydrofuran-2-yl, tetrahydropyran-2-yl, 2-ethoxyethyl and tert-butoxyethyl.

Preferably, the compound of Chemical Formula 1 is selected from the group consisting of the following compounds:

mono-2-ethyl-2-(hydroxymethyl)butyl bicyclo[2.2.1]hept-5-ene-2,3-dicarboxylate;

mono-2-dimethyl-3-hydroxypropyl bicyclo[2.2.1]hept-5-ene-2,3-dicarboxylate;

mono-3-hydroxypropyl bicyclo[2.2.1]hept-5-ene-2,3-dicarboxylate;

mono-2-hydroxyethyl bicyclo[2.2.1]hept-5-ene-2,3-dicarboxylate;

mono-2-ethyl-2-(hydroxymethyl)butyl bicyclo[2.2.21]oct-5-ene-2,3-dicarboxylate;

mono-2-dimethyl-3-hydroxypropyl bicyclo[2.2.2]oct-5-ene-2,3-dicarboxylate;

mono-3-hydroxypropyl bicyclo[2.2.2]oct-5-ene-2,3-dicarboxylate;

mono-2-hydroxyethyl bicyclo[2.2.2]oct-5-ene-2,3-dicarboxylate;

mono-2-ethyl-2-(hydroxymethyl)butyl tetracyclo[4.4.0.1.1]dodec-7-ene-2,3-dicarboxylate;

mono-2-dimethyl-3-hydroxypropyl tetracyclo[4.4.0.1.1]dodec-7-ene-2,3-dicarboxylate;

mono-3-hydroxypropyl tetracyclo[4.4.0.1.1]dodec-7-ene-2,3-dicarboxylate;

mono-2-hydroxyethyl tetracyclo[4.4.0.1.1]dodec-7-ene-2,3-dicarboxylate;

mono-2-ethyl-2-(hydroxymethyl)butyl tetracyclo[4.4.0.2.2]tetradec-7-ene-2,3-dicarboxylate;

mono-2-dimethyl-3-hydroxypropyl tetracyclo[4.4.0.2.2]tetradec-7-ene-2,3-dicarboxylate;

mono-3-hydroxypropyl tetracyclo[4.4.0.2.2]tetradec-7-ene-2,3-dicarboxylate; and mono-2-hydroxyethyl tetracyclo[4.4.0.2.2]tetradec-7-ene-2,3-dicarboxylate.

Preferably, the compound of Chemical Formula 2 is selected from the group consisting of the following compounds:

tert-butyl bicyclo[2.2.1]hept-5-ene-2-carboxylate;

tert-butyl bicyclo[2.2.2]oct-5-ene-2-carboxylate;

tert-butyl tetracyclo[4.4.0.1.1]dodec-7-ene-2-carboxylate; and tert-butyl tetracyclo[4.4.0.2.2]tetradec-7-ene-2-carboxylate.

The compound of Chemical Formula 3 is preferably 3-[tris(trimethylsiloxy)silyl]propyl methacrylate represented by following Chemical Formula 3a:

<Chemical Formula 3a>

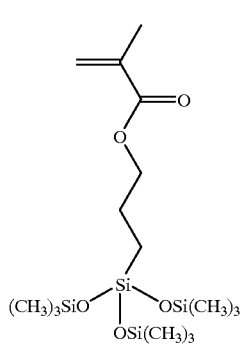

Preferred photoresist polymers according to the present invention are represented by following Chemical Formula 5:

<Chemical Formula 5>

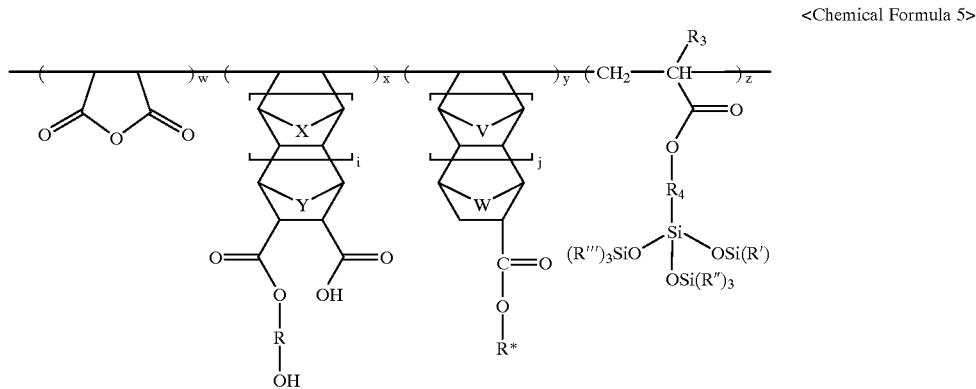

<Chemical Formula 6>

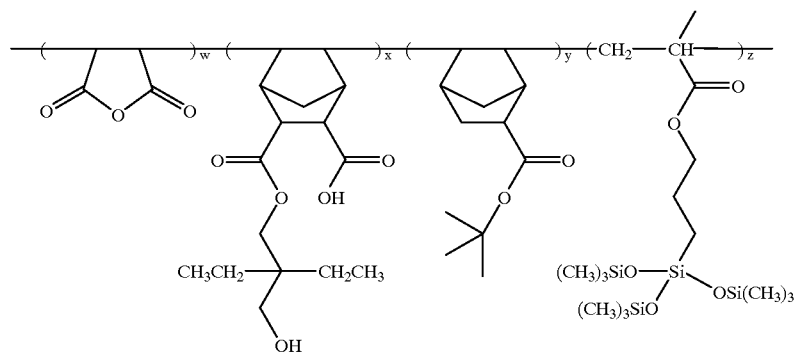

wherein, R, R*, X, Y, V, W, i, j, $R_3$, $R_4$, R', R" and R'" are those defined above, and w, y, x, and z represent the relative amounts of each monomer, wherein the ratio of w:x:y:z=0–85 mol %:5–90 mol %:5–90 mol %:5–90 mol %.

Preferably, molecular weight of the polymers represented by following Chemical Formula 5 is from 3,000 to 100,000.

Examples of preferred polymers of the present invention are:

Poly(maleic anhydride/mono-2-ethyl-2-(hydroxymethyl) butyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate);

Poly(maleic anhydride/mono-2-ethyl-2-(hydroxymethyl) butyl bicyclo-[2.2.2]oct-5-ene-2,3-dicarboxylate/tert-butyl bicyclo-[2.2.1]hept-5-ene-2-carboxylate/3-[tris(trimethylsiloxy)silyl]propyl methacrylate);

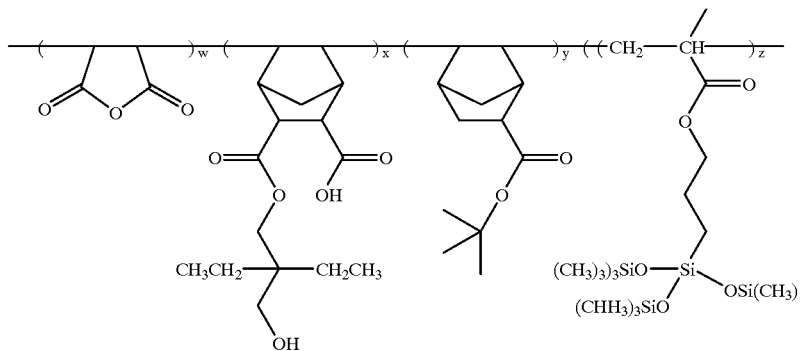

<Chemical Formula 7>

Poly(maleic anhydride/mono-2-methyl-2-(hydroxymethyl)propyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate);

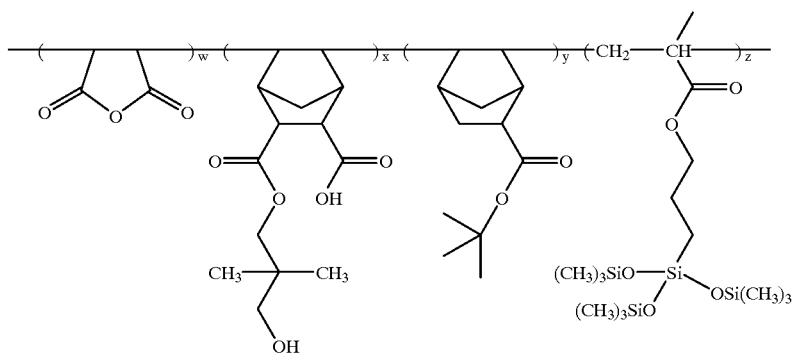

<Chemical Formula 8>

Poly(maleic anhydride/3-hydroxypropyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate); and

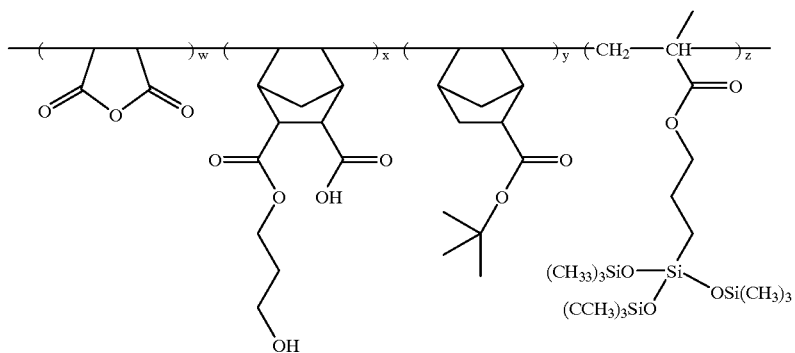

<Chemical Formula 9>

Poly(maleic anhydride/2-hydroxyethyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate);

<Chemical Formula 10>

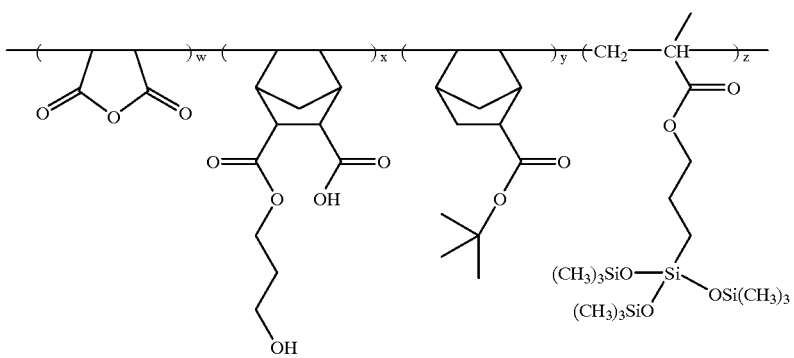

Polymers of the present invention can be prepared by a variety of methods. In one particularly preferred method, polymers of the present invention are prepared by (a) dissolving in an organic solvent (i) a compound of Chemical Formula 1, (ii) a compound of Chemical Formula 2, (iii) a compound of Chemical Formula 3, and (iv) maleic anhydride of Chemical Formula 4; (b) adding a polymerization initiator thereto; and (c) heating the solution resulting from step (b) to temperature in the range of from about 60 to about 70° C. for 4 to 24 hours under an inert atmosphere, preferably under a nitrogen or an argon atmosphere.

In the above preparation process, polymerization is performed by a bulk or solution polymerization.

While a variety of organic solvents can be used to prepare the polymers of the present invention, the organic solvent is preferably selected from the group consisting of cyclohexanone, tetrahydrofuran, dimethylformamide, dimethylsulfoxide, dioxane, methyl ethyl ketone, benzene, toluene, xylene, and mixtures thereof.

Advantageously, the polymerization initiator is selected from the group consisting of benzoyl peroxide, 2,2'-azobisisobutyronitrile (AIBN), acetyl peroxide, lauryl peroxide, tert-butyl peracetate, tert-butyl hydroperoxide and di-tert-butyl peroxide.

Alternatively, it is contemplated that the polymers of the present invention may be prepared without the maleic anhydride monomer using known polymerization techniques, for example, by using a metal catalyst process as described in Goodall et al, PCT Publication Number WO 96/37526.

The present invention also provides a photoresist composition comprising a photoresist polymer of the present invention, an organic solvent and a photoacid generator.

Sulfide or onium-type compounds are preferably used as the photoacid generator. Suitable photoacid generators are selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate. Preferably, the amount of photoacid generator is in the range of 0.1 to 10% by weight of the polymer.

The organic solvent is preferably selected from the group consisting of methyl 3-methoxypropionate, ethyl 3-ethoxypropionate, propylene glycol methyl ether acetate and cyclohexanone.

In one aspect of the present invention, the photoresist composition is prepared by dissolving the polymer in an amount of 10 to 30% by weight of the organic solvent employed, blending the photoacid generator in an amount of 0.1 to 10% by weight of the polymer employed, and filtering the resulting mixture with a hyperfine filter.

The photoresist composition of the present invention has superior etching resistance, heat resistance and adhesiveness. In addition, the photoresist composition can be developed in 2.38 wt % aqueous TMAH solution. Moreover, the photoresis compositions of the present invention can be used as an ArF photoresist film. The photoresist composition can be advantageously used in a patterning process employing a bi-layer resist, but can also be used in a process employing a single layer resist.

The present invention also provides a process for forming a photoresist pattern, including the steps of: (a) coating a conventional photoresist composition on a substrate of a semiconductor element to form a first photoresist layer; (b) coating a photoresist composition of the present invention on the surface of the first photoresist layer to form a second photoresist layer; (c) exposing the second photoresist layer to light using a light source; (d) developing the second photoresist layer to form a second photoresist pattern; and (e) etching the first photoresist layer by using the second photoresist pattern as an etching mask.

The process for forming the photoresist pattern can further include a baking step before and/or after exposure step (c). The baking step is typically performed at a temperature range of 70 to 200° C.

The exposure step employs ArF, KrF, VUV, EUV, E-beam, X-ray or ion beam as a light source, and is performed advantageously with an exposure energy of 0.1 to 10 mJ/cm$^2$.

The process for forming the photoresist pattern will now be described in more detail with reference to FIG. 1:

First, a conventional photoresist composition such as an i-line (365 nm) or g-line (436 nm) photoresist composition is coated on the substrate 11 of a semiconductor to form a first photoresist layer 12. A second thin photoresist layer 13 is formed by spin-coating a photoresist composition of the present invention thereon. The second photoresist layer is soft baked in an oven or hot plate of 80 to 150° C. for 1 to 5 minutes, exposed to light by using an ultraviolet exposer or excimer laser exposer, and then baked at 100 to 200° C. The exposed wafer is submersed in a 2.38 wt % aqueous TMAH solution for 90 seconds, thereby obtaining an ultrafine positive resist image in the second photoresist layer ("second photoresist pattern"). Thereafter, the second photoresist pattern is transferred to the first photoresist layer below it by using O$_2$ plasma to etch the first photoresist layer using the second photoresist pattern as a mask, thereby forming the desired photoresist pattern in the first photoresist layer.

Furthermore, the present invention provides a semiconductor element manufactured by employing the above-described photoresist composition.

The present invention will now be described in detail in the examples below, but it should be noted that the present invention is not restricted to these examples.

I. PREPARATION OF PHOTORESIST POLYMER

EXAMPLE 1

Synthesis of poly(maleic anhydride/mono-2-ethyl-2-(hydroxymethyl)butyl bicyclo[2.2.1]hept-5-ene-2.3-dicarboxylate/tert-butyl bicyclo-[2.2.1]hept-5-ene-2-carboxylate/3-[tris(trimethylsiloxy)silyl]propyl methacrylate)

1.0 mole of maleic anhydride, 0.2 mole of mono-2-ethyl-2-(hydroxymethyl)butyl bicyclo-[2.2.1]hept-5-ene-2,3-dicarboxylate, 0.7 mole of tert-butyl bicyclo-[2.2.1]hept-5-ene-2-carboxylate and 0.1 mole of 3-[tris(trimethylsiloxy) silyl]propyl methacrylate are dissolved in tetrahydrofuran, 0.5 to 10 g of AIBN is added thereto as the polymerization initiator, and the resultant mixture is reacted at approximately 60 to 70° C. for 4 to 24 hours under a nitrogen or argon atmosphere.

The polymer thus prepared is precipitated in ethyl ether or hexane and dried, thereby obtaining the compound of Chemical Formula 6.

EXAMPLE 2

Synthesis of poly(maleic anhydride/mono-2-ethyl-2-(hydroxymethyl)butyl bicyclo[2.2.2]oct-5-ene-2,3-dicarboxylate/tert-butyl bicyclo-[2.2.1]hept-5-ene-2-carboxylate/3-[tris(trimethylsiloxy)silyl]propyl methacrylate)

The compound of Chemical Formula 7 is prepared by repeating the procedure of Example 1 but employing 0.2 mole of mono-2-ethyl-2-(hydroxymethyl)butyl bicyclo-[2.2.2]oct-5-ene-2,3-dicarboxylate, instead of 0.2 mole of mono-2-ethyl-2-(hydroxymethyl)butyl bicyclo-[2.2.1]hept-5-ene-2,3-dicarboxylate.

EXAMPLE 3

Synthesis of poly(maleic anhydride/mono-2-methyl-2-(hydroxymethyl)propyl bicyclo[2.2.1]hept-5-ene-2.3-dicarboxylate/tert-butyl bicyclo-[2.2.1]hept-5-ene-2-carboxylate/3-[tris(trimethylsiloxy)silyl] propyl methacrylate)

The compound of Chemical Formula 8 is prepared by repeating the procedure of Example 1 but using 0.2 mole of mono-2-methyl-2-(hydroxymethyl)propyl bicyclo-[2.2.1] hept-5-ene-2,3-dicarboxylate, instead of 0.2 mole of mono-2-ethyl-2-(hydroxymethyl)butyl bicyclo-[2.2. 1]hept-5-ene-2,3-dicarboxylate.

EXAMPLE 4

Synthesis of poly(maleic anhydride/3-hydroxypropyl bicyclo[2.2.1]hept-5-ene-2.3-dicarboxylate/tert-butyl bicyclo-[2.2.1]hept-5-ene-2-carboxylate/3-[tris(trimethylsiloxy)silyl]propyl methacrylate)

The compound of Chemical Formula 9 is prepared by repeating the procedure of Example 1 but employing 0.2 mole of 3-hydroxypropyl bicyclo-[2.2.1]hept-5-ene-2,3-dicarboxylate, instead of 0.2 mole of mono-2-ethyl-2-(hydroxymethyl)butyl bicyclo-[2.2.1]hept-5-ene-2,3-dicarboxylate.

EXAMPLE 5

Synthesis of poly(maleic anhydride/2-hydroxyethyl bicyclo[2.2.1]hept-5-ene-2.3-dicarboxylate/tert-butyl bicyclo-[2.2.1]hept-5-ene-2-carboxylate/3-[tris(trimethylsiloxy)silyl]propyl methacrylate)

The compound of Chemical Formula 10 is prepared by repeating the procedure of Example 1 but employing 0.2 mole of 2-hydroxyethyl bicyclo-[2.2.1]hept-5-ene-2,3-dicarboxylate, instead of 0.2 mole of mono-2-ethyl-2-(hydroxymethyl)butyl bicyclo-[2.2.1]hept-5-ene-2,3-dicarboxylate.

II. PREPARATION OF PHOTORESIST COMPOSITION AND FORMATION OF PATTERN

EXAMPLE 6

10 g of the polymer prepared in Example 1 is dissolved in 40g of methyl 3-methoxypropionate solvent, and 0.01 to 1 g of triphenylsulfonium triflate or dibutylnaphthylsulfonium triflate is added thereto as the photoacid generator. The resultant mixture is stirred and filtered through a 0.10 $\mu$m filter to prepare a photoresist composition.

Figure 2:
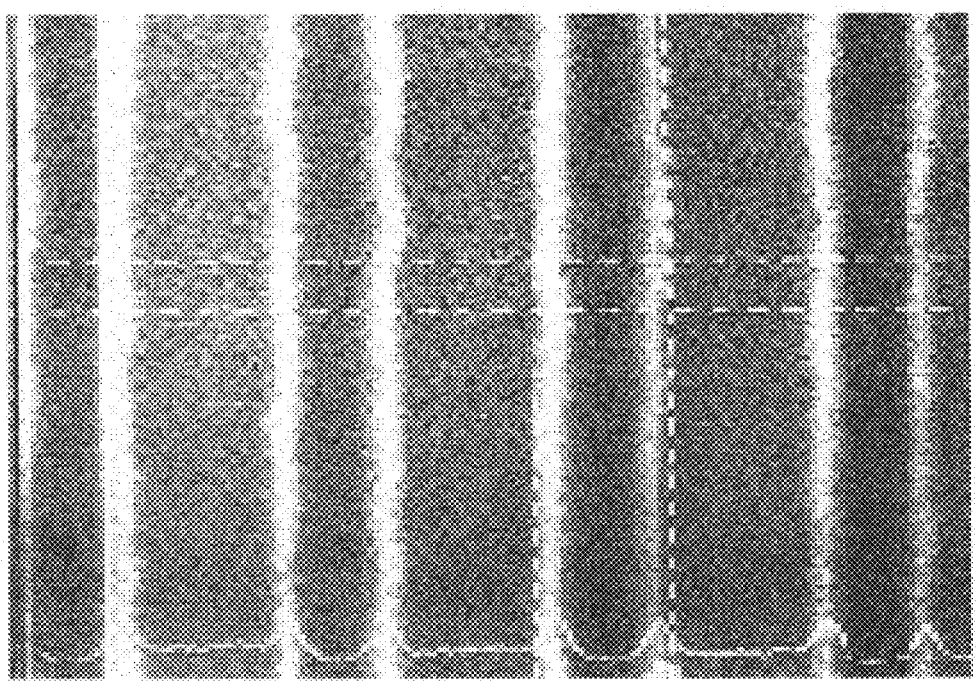
FIG. 2 shows a photoresist pattern obtained in Example 6.

The photoresist composition thus prepared is spin-coated on a silicon wafer, and soft-baked in an oven or hot plate of 80 to 150° C. for 1 to 5 minutes. After baking, the photoresist is exposed to light by using an ArF laser exposer, and then post-baked at 100 to 200° C. When the post-baking is completed, it is developed in 2.38 wt % aqueous TMAH (tetramethylammonium hydroxide) solution for 90 seconds, to obtain a 0.13 $\mu$m L/S pattern when the thickness of the photoresist layer is about 0.2$\mu$m (See FIG. 2).

EXAMPLE 7

Figure 3:
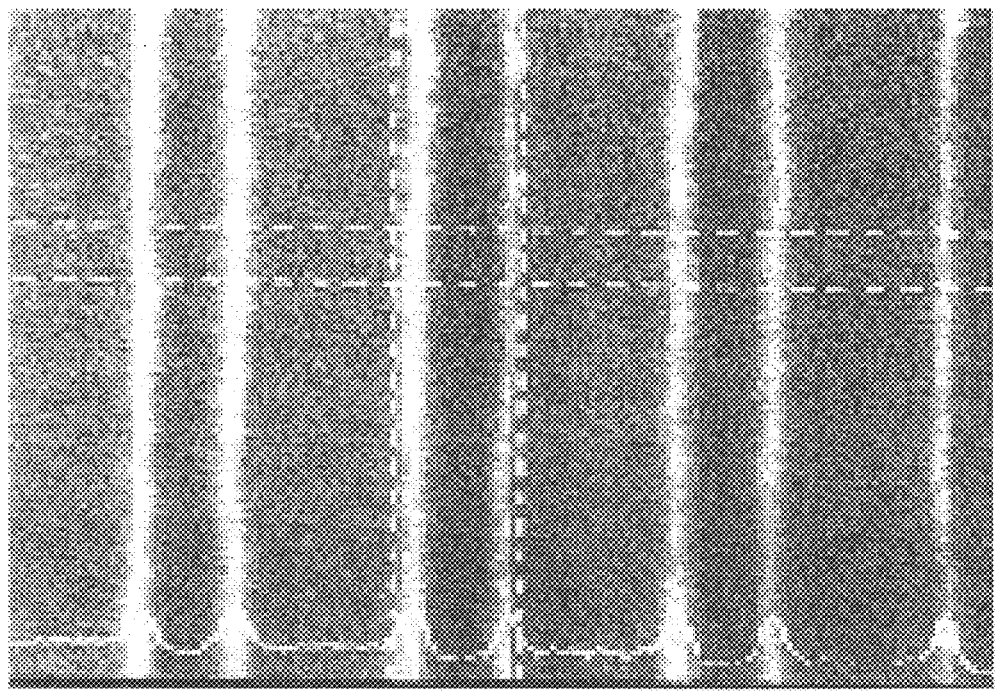
FIG. 3 shows a photoresist pattern obtained in Example 7.

A photoresist composition is prepared by repeating the procedure of Example 6 but using the polymer prepared in Example 2, instead of the polymer of Example 1. By employing this composition, a 0.13 m L/S pattern was obtained when the thickness of the photoresist layer is about 0.2 $\mu$m (See FIG. 3).

Photoresist compositions prepared by employing a polymer of the present invention has excellent etching resistance, heat resistance and adhesiveness to the wafer, and is easily developed in 2.38 wt % aqueous TMAH solution. Accordingly, the photoresist composition can be advantageously used as an ArF photoresist layer in a semiconductor device.

Especially, when a photoresist composition having superior adhesiveness to the wafer is employed, even if the photoresist thickness is 0.2 $\mu$m, resolution of a 0.13 $\mu$m L/S pattern and death of focus (DOF) are satisfactory. Consequently, a high integration semiconductor device having reliability can be manufactured by using the photoresist composition in accordance with the present invention.

What is claimed is:
1. A photoresist polymer comprising repeating units derived from (a) a compound of the following Chemical Formula 1; (b) a compound of the following Chemical Formula 2; and (c) a compound of the following Chemical Formula 3;

<Chemical Formula 1>

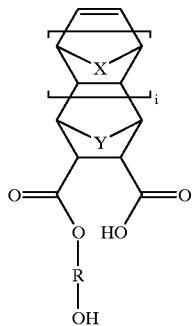

wherein, R is substituted or unsubstituted linear or branched ($C_1$–$C_{10}$) alkylene, substituted or unsubstituted ($C_2$–$C_{10}$) alkylene comprising an ether linkage, substituted or unsubstituted ($C_2$–$C_{10}$) alkylene comprising an ester linkage, or substituted or unsubstituted ($C_3$–$C_{10}$) alkylene comprising a ketone moiety;

X and Y are independently $CH_2$, $CH_2CH_2$, oxygen or sulfur; and i is an integer from 0 to 2;

<Chemical Formula 2>

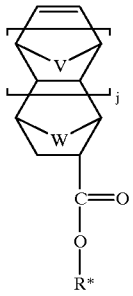

wherein, V and W are independently $CH_2$, $CH_2CH_2$, oxygen or sulfur;

R* is an acid-labile group; and j is an integer from 0to 2;

<Chemical Formula 3>

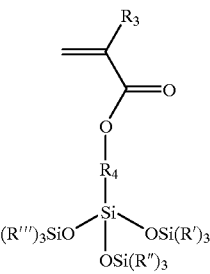

wherein, $R_3$ represents hydrogen or methyl;

$R_4$ is substituted or unsubstituted linear or branched ($C_1$–$C_{10}$) alkylene;

R', R" and R'" are independently substituted or unsubstituted linear or branched ($C_1$–$C_5$) alkyl.

2. The photoresist polymer according to claim 1, which further comprises maleic anhydride of following Chemical Formula 4:

<Chemical Formula 4>

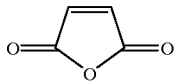

3. The photoresist polymer according to claim 1, wherein the molecular weight of the polymer is in the range of from 3,000 to 100,000.

4. The photoresist polymer according to claim 1, wherein said R is represented by following Chemical Formula 1a:

<Chemical Formula 1a>

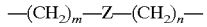

wherein, Z is

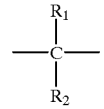

or oxygen;

$R_1$ and $R_2$ are independently H or an ($C_1$–$C_5$) alkyl; and m and n are independently an integer from 0 to 5, provided m and n are independently an integer from 1 to 5 when Z is oxygen.

5. The photoresist polymer according to claim 1, wherein said R* is selected from the group consisting of tert-butyl, tetrahydrofuran-2-yl, tetrahydropyran-2-yl, 2-ethoxyethyl or tert-butoxyethyl.

6. The photoresist polymer according to claim 1, wherein the compound of Chemical Formula 1 is selected from the group consisting of:

mono-2-ethyl-2-(hydroxymethyl)butyl bicyclo[2.2.1]hept-5-ene-2,3-dicarboxylate;

mono-2-dimethyl-3-hydroxypropyl bicyclo[2.2.1]hept-5-ene-2,3-dicarboxylate;

mono-3-hydroxypropyl bicyclo [2.2.1]hept-5-ene-2,3-dicarboxylate;

mono-2-hydroxyethyl bicyclo[2.2.1]hept-5-ene-2,3-dicarboxylate;

mono-2-ethyl-2-(hydroxymethyl)butyl bicyclo[2.2.2]oct-5-ene-2,3-dicarboxylate;

mono-2-dimethyl-3-hydroxypropyl bicyclo[2.2.2]oct-5-ene-2,3-dicarboxylate;

mono-3-hydroxypropyl bicyclo[2.2.2]oct-5-ene-2,3-dicarboxylate;

mono-2-hydroxyethyl bicyclo[2.2.2]oct-5-ene-2,3-dicarboxylate;

mono-2-ethyl-2-(hydroxymethyl)butyl tetracyclo[4.4.0.1.1]dodec-7-ene-2,3-dicarboxylate;

mono-2-dimethyl-3-hydroxypropyl tetracyclo[4.4.0.1.1]dodec-7-ene-2,3-dicarboxylate;

mono-3-hydroxypropyl tetracyclo[4.4.0.1.1]dodec-7-ene-2,3-dicarboxylate;

mono-2-hydroxyethyl tetracyclo[4.4.0.1.1]dodec-7-ene-2,3-dicarboxylate;

mono-2-ethyl-2-(hydroxymethyl)butyl tetracyclo[4.4.0.2.2]tetradec-7-ene-2,3-dicarboxylate;

mono-2-dimethyl-3-hydroxypropyl tetracyclo[4.4.0.2.2]tetradec-7-ene-2,3-dicarboxylate;

mono-3-hydroxypropyl tetracyclo[4.4.0.2.2]tetradec-7-ene-2,3-dicarboxylate; and mono-2-hydroxyethyl tetracyclo[4.4.0.2.2]tetradec-7-ene-2,3-dicarboxylate; and the compound of Chemical Formula 2 is selected from the group consisting of:
tert-butyl bicyclo[2.2.1]hept-5-ene-2-carboxylate;
tert-butyl bicyclo[2.2.2]oct-5-ene-2-carboxylate;
tert-butyl tetracyclo[4.4.0.1.1]dodec-7-ene-2-carboxylate; and
tert-butyl tetracyclo[4.4.0.2.2]tetradec-7-ene-2-carboxylate.

7. The photoresist polymer according to claim 1, wherein the compound of Chemical Formula 3 is 3-[tris(trimethylsiloxy)silyl]propyl methacrylate represented by the following Chemical Formula 3a.

<Chemical Formula 3a>

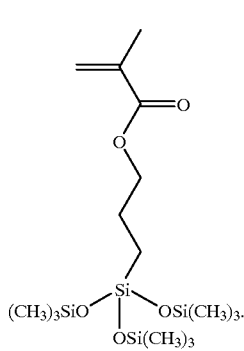

8. A photoresist polymer represented by the following Chemical Formula 5;

the ratio of w:x:y:z=0–85 mol %:5–90 mol %:5–90 mol %:5–90 mol %.

9. The photoresist polymer according to claim 8, which is selected from the group consisting of:
poly(maleic anhydride/mono-2-ethyl-2-(hydroxymethyl) butyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate);
poly(maleic anhydride/mono-2-ethyl-2-(hydroxymethyl) butyl bicyclo-[2.2.2]oct-5-ene-2,3-dicarboxylate/tert-butyl bicyclo-[2.2.1]hept-5-ene-2-carboxylate/3-[tris(trimethylsiloxy)silyl]propyl methacrylate);
poly(maleic anhydride/mono-2-methyl-2-(hydroxymethyl)propyl bicyclo-[2.2.1]hept-5-ene-2,3-dicarboxylate/tert-butyl bicyclo-[2.2.1]hept-5-ene-2-carboxylate/3-[tris(trimethylsiloxy)silyl]propyl methacrylate);
poly(maleic anhydride/3-hydroxypropyl bicyclo-[2.2.1] hept-5-ene-2,3-dicarboxylate/tert-butyl bicyclo-[2.2.1] hept-5-ene-2-carboxylate/3-[tris(trimethylsiloxy)silyl] propyl methacrylate); and
poly(maleic anhydride/2-hydroxyethyl bicyclo-[2.2.1] hept-5-ene-2,3-dicarboxylate/tert-butyl bicyclo-[2.2.1] hept-5-ene-2-carboxylate/3-[tris(trimethylsiloxy)silyl] propyl methacrylate).

10. A process for preparing a photoresist polymer of claim 1, comprising the steps of:
(a) dissolving in an organic solvent (i) a compound represented by Chemical Formula 1; (ii) a compound represented by Chemical Formula 2; (iii) a compound represented by Chemical Formula 3; and (iv) maleic anhydride;

<Chemical Formula 5>

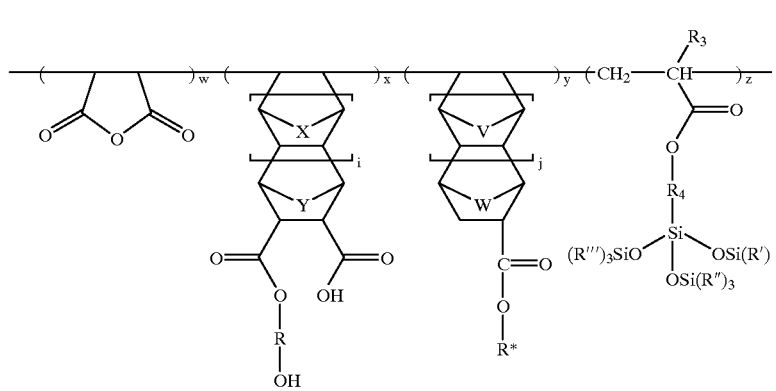

wherein, R is substituted or unsubstituted linear or branched ($C_1$–$C_{10}$) alkylene, substituted or unsubstituted ($C_2$–$C_{10}$) alkylene comprising an ether linkage, substituted or unsubstituted ($C_2$–$C_{10}$) alkylene comprising an ester linkage, or substituted or unsubstituted ($C_3$–$C_{10}$) alkylene comprising a ketone moiety;

R* is an acid labile group;

X, Y, V and W are independently $CH_2$, $CH_2CH_2$, oxygen or sulfur;

i and j are independently an integer from 0 to 2;

$R_3$ represents hydrogen or methyl;

$R_4$ is substituted or unsubstituted linear or branched ($C_1$–$C_{10}$) alkylene;

R', R" and R'" are independently substituted or unsubstituted linear or branched ($C_1$–$C_5$) alkyl; and (b) adding a polymerization initiator to the solution resulting from step (a); and (c) heating the solution of step (b) to temperature in the range of 60 to 70° C. for 4 to 24 hours under an inert atmosphere.

11. The process according to claim 10, wherein the organic solvent is selected from the group consisting of cyclohexanone, tetrahydrofuran, dimethylformamide, dimethylsulfoxide, dioxane, methyl ethyl ketone, benzene, toluene, xylene, and mixtures thereof.

12. The process according to claim 10, wherein the polymerization initiator is selected from the group consisting of benzoyl peroxide, 2,2'-azobisisobutyronitrile, acetyl peroxide, lauryl peroxide, tert-butyl peracetate, tert-butyl hydroperoxide and di-tert-butyl peroxide.

13. The process according to claim 10, wherein the radical polymerization is performed by a bulk or solution polymerization.

14. A photoresist composition comprising (i) a photoresist polymer according to claim 1, (ii) an organic solvent and (iii) a photoacid generator.

15. The composition according to claim 14, wherein the photoacid generator is a sulfide or onium-type compound.

16. The composition according to claim 14, wherein the photoacid generator comprises one or more compounds selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

17. The photoresist composition according to claim 14, wherein the amount of said photoacid generator is in the range of 0.1 to 10% by weight of the polymer employed.

18. The photoresist composition according to claim 14, wherein the organic solvent is selected from the group consisting of methyl 3-methoxypropionate, ethyl 3-ethoxypropionate, propylene glycol methyl ether acetate and cyclohexanone.

19. The photoresist composition according to claim 14, wherein the amount of said polymer is in the range of 10 to 30% by weight of the organic solvent employed.

20. A process for forming a photoresist pattern, comprising the steps of (a) coating a conventional photoresist composition on a substrate of a semiconductor element to form a first photoresist layer; (b) coating the photoresist composition of claim 14 on the surface of the first photoresist layer to form a second photoresist layer; (c) exposing the second photoresist layer to light using a light source; (d) developing the second photoresist layer to form a second photoresist pattern; and (e) etching the first photoresist film by using the second photoresist pattern as an etching mask.

21. The process according to claim 20, further comprising baking step(s) before and/or after step (c).

22. The process according to claim 21, wherein the baking step is performed at 70 to 200° C.

23. The process according to claim 20, wherein said light source is selected from the group consisting of ArF, KrF, VUV, EUV, E-beam, X-ray and ion beam.

24. The process according to claim 20, wherein the step (c) is performed by irradiating 0.1 to 100 mJ/cm$^2$ of light-exposure energy.

25. The process according to claim 20, wherein the etching of step (e) is a dry etching using $O_2$ plasma.

26. The process according to claim 20, wherein the conventional photoresist composition of step (a) is photoresist composition for i-line (365 nm) or g-line (436 nm).

27. A semiconductor element manufactured by employing the process according to claim 20.

* * * * *

UNITED STATES PATENT AND TRADEMARK OFFICE
CERTIFICATE OF CORRECTION

PATENT NO. : 6,368,771 B1
DATED : April 9, 2002
INVENTOR(S) : Cha Won Koh, Geun Su Lee, Jae Chang Jung and Myoung Soo Kim It is certified that error appears in the above-identified patent and that said Letters Patent is hereby corrected as shown below:

Columns 5-6,
Lines 22-40, the Chemical Formula 5 should read

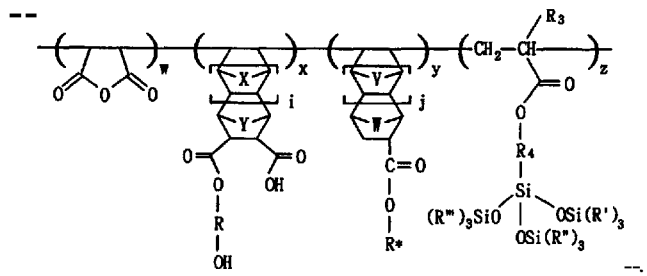

Columns 7-8,
Lines 47-63, the Chemical Formula 9 should read

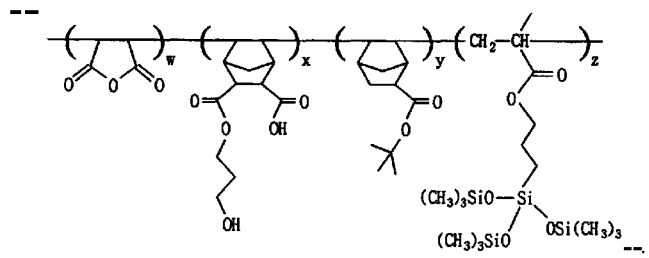

Column 9,
Line 56, the "hexafluororphosphate" should read -- hexafluorophosphate --.

Column 10,
Line 26, the "photoresis" should read -- photoresist --.

UNITED STATES PATENT AND TRADEMARK OFFICE
CERTIFICATE OF CORRECTION

PATENT NO. : 6,368,771 B1
DATED : April 9, 2002
INVENTOR(S) : Cha Won Koh, Geun Su Lee, Jae Chang Jung and Myoung Soo Kim It is certified that error appears in the above-identified patent and that said Letters Patent is hereby corrected as shown below:

<u>Column 17,</u>
Line 16, the "hexafluororphosphate" should read -- hexafluorophosphate --.

Signed and Sealed this

Twenty-second Day of October, 2002

*Attest:*

JAMES E. ROGAN
*Attesting Officer*     *Director of the United States Patent and Trademark Office*